United States Patent [19]
Phelps

[11] Patent Number: 5,847,317
[45] Date of Patent: Dec. 8, 1998

[54] PLATED RUBBER GASKET FOR RF SHIELDING

[75] Inventor: Craig Phelps, Raleigh, N.C.

[73] Assignee: Ericsson Inc., Research Triangle Park, N.C.

[21] Appl. No.: 846,625

[22] Filed: Apr. 30, 1997

[51] Int. Cl.⁶ ...................................................... H05K 9/00

[52] U.S. Cl. .................................. 174/35 R; 174/35 GC; 174/51; 361/753; 361/816

[58] Field of Search .............................. 174/35 GC, 35 R, 174/51; 361/816, 818, 753, 799, 800; 277/235 R, 901; 439/271, 272, 927

[56] References Cited

U.S. PATENT DOCUMENTS

| | | | |
|---|---|---|---|
| 4,831,498 | 5/1989 | Baba | 361/424 |
| 5,596,487 | 1/1997 | Castaneda et al. | 361/814 |
| 5,597,979 | 1/1997 | Courtney et al. | 174/35 R |

*Primary Examiner*—Kristine L. Kincaid
*Assistant Examiner*—Hung V. Ngo
*Attorney, Agent, or Firm*—Jenkins & Gilchrist, P.C.

[57] ABSTRACT

An improved RF shielding apparatus includes a shield frame having a nonconductive gasket mounted to the edges thereof. A conductive layer is deposited on the gasket and shield frame such that a substantially continuous layer surrounds the gasket and shield frame.

6 Claims, 3 Drawing Sheets

PLATED RUBBER GASKET FOR RF SHIELDING

BACKGROUND OF THE INVENTION

1. Technical Field of the Invention

The present invention relates to RF shielding for electronic components, and more particularly, to an RF shield and gasket combination coated with a conductive layer to provide a continuous electrical contact between the RF shield and a printed circuit board.

2. Description of Related Art

The electronic components of devices such as cellular telephones must be protected from interfering RF signals which can degrade or prevent proper performance of the components. One present method for accomplishing this requires placing a metal coated plastic frame over the electronic components to shield the components and prevent external interference from hampering the operation of the electronic components. The shielding is attached to the ground plane of the printed circuit board (PCB).

Making electrical contact between the ground plane of a printed circuit board and the electrically conductive surface of the RF shield in a cellular telephone is a tricky operation. The electrical contact must be nearly continuous around the perimeter of the shield to prevent penetration of unwanted electromagnetic energy. However, due to manufacturing variances and tolerances, the mating surfaces of the shield and the PCB often do not touch. Thus, a contact medium between the shield and the PCB must be compliant enough to take up the spaces created by these tolerances while still maintaining a continuous electrical contact. Additionally, with today's competitive cellular telephone market, the costs of the contact medium must be kept as low as possible.

A number of solutions have been devised to solve this problem. The one method involves the use of a conductive rubber gasket that is placed between the ground plane of the PCB and the plated RF shield. The gasket is constructed of silicone rubber loaded with a sufficient amount of conductive silver particles to render the rubber essentially conductive. The rubber is deposited around the perimeter of the shield and cured at a high temperature to bond it to the shield surface. While the solution is highly effective, the cost of the gaskets is high. The impregnation of the silicone rubber gaskets with conductive particles tends to be very expensive.

An alternative solution involves the use of compliant metal spring fingers which are integrated with the shield to maintain electrical contact with the printed circuit board ground plane. Unfortunately, this solution has a potential for developing short circuits if the somewhat fragile spring fingers deform and contact the printed circuit board in areas other than the ground plane. Conductive foam rubber gaskets impregnated with silver or carbon particles are also used in the industry but suffer from the same cost limitations discussed previously. Therefore, a new manner of ensuring a continuous electrical contact between an RF shield and the ground plane of a printed circuit board is needed that does not have the cost limitations or short circuiting characteristics inherent in presently existing solutions.

SUMMARY OF THE INVENTION

The present invention overcomes the foregoing and other problems with an improved RF shielding apparatus. The apparatus consist of a shield frame comprised of plastic, metal, or some other acceptable material that acts as a cover for the electronic components to be shielded. A nonconductive gasket is attached to the edges of the shield frame to act as a pliable connection between the shield frame and a ground plane on a printed circuit board. In one embodiment, the nonconductive gasket may comprise an elastic band which is stretched and mounted around a plurality of guideposts along the edges of the shield frame.

A conductive layer is deposited around the shield frame and attached gasket such that the layer covers an amount of the gasket and shield necessary to provide conductive continuity between PCB, gasket, and shield when assembled. The deposition of the conductive layer may be done by a vacuum metalization process or by painting a metallic paint thereon.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE DRAWINGS

Figure 1:
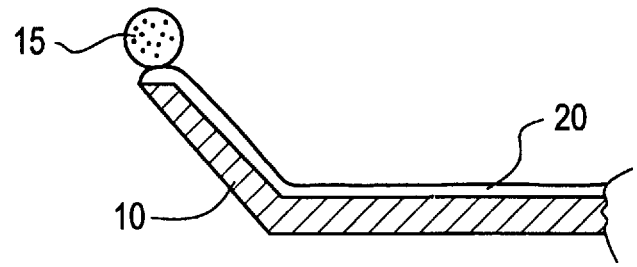
FIG. 1 illustrates the prior art solution of applying a conductive rubber gasket to an RF shielding after plating of the plastic frame.

Referring now to the Drawings, and more particularly to FIG. 1, there is illustrated the prior art embodiment of an RF shield including a coated plastic frame 10 and a conductive rubber gasket 15. As can be seen from the figure, the metal plating 20 covers only the plastic frame 10 and not the conductive rubber gasket 15. Electrical conductivity between the plated plastic frame 10 and the ground plane of a printed circuit board (PCB) is achieved through the conductive rubber gasket 15.

The conductive rubber gasket 15 is easily the most expensive portion of the RF shield. The plastic or metal frame costs approximately fifty cents ($0.50). The metalization process for coating the plastic frame costs approximately five cents ($0.05). However, the conductive rubber gasket costs approximately two dollars and fifty cents ($2.50). Thus, the majority of the cost associated with the RF shield comes from the conductive gasket.

Figure 2:
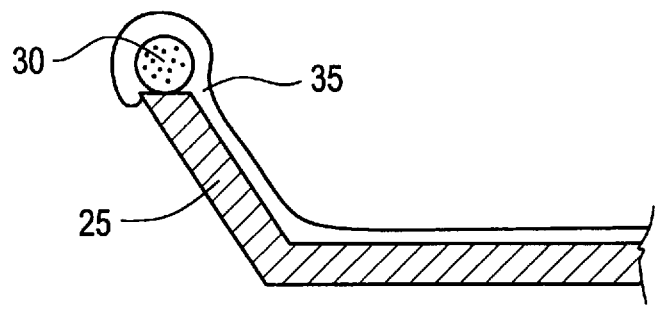
FIG. 2 illustrates the RF shielding of the present invention wherein a nonconductive rubber gasket is placed on a plastic frame prior to plating of the frame and gasket.
Figure 3:
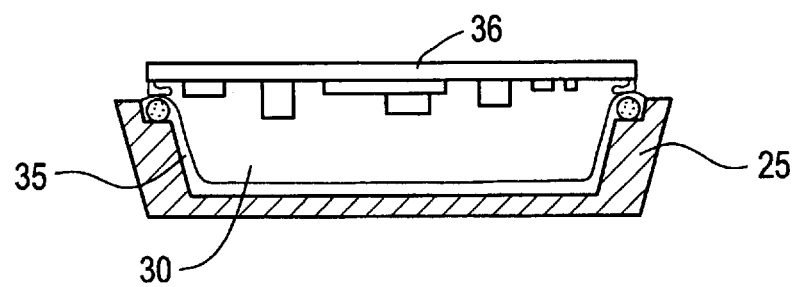
FIG. 3 is an end view illustrating an RF shield of the present invention applied to a cellular telephone printed circuit board.

Referring now to FIG. 2, there is illustrated an embodiment of the present invention. The present invention utilizes a plastic frame 25 to which a nonconductive rubber gasket 30 is attached by molding or die-cutting the gasket and then gluing or snapping the assembly onto the frame. Alternatively, the gasket may be dispensed into the frame edge. The gasket may also be a conductive gasket. Both the plastic frame 25 and the attached nonconductive rubber gasket 30 are then metal plated using a process such as vacuum metalization. The metalization may also be performed separately on each part before assembly. The RF shield having the continuous metal plating layer 35 may then be placed into contact with the RF plane of a printed circuit board 36 as shown generally in FIG. 3.

Figure 4:
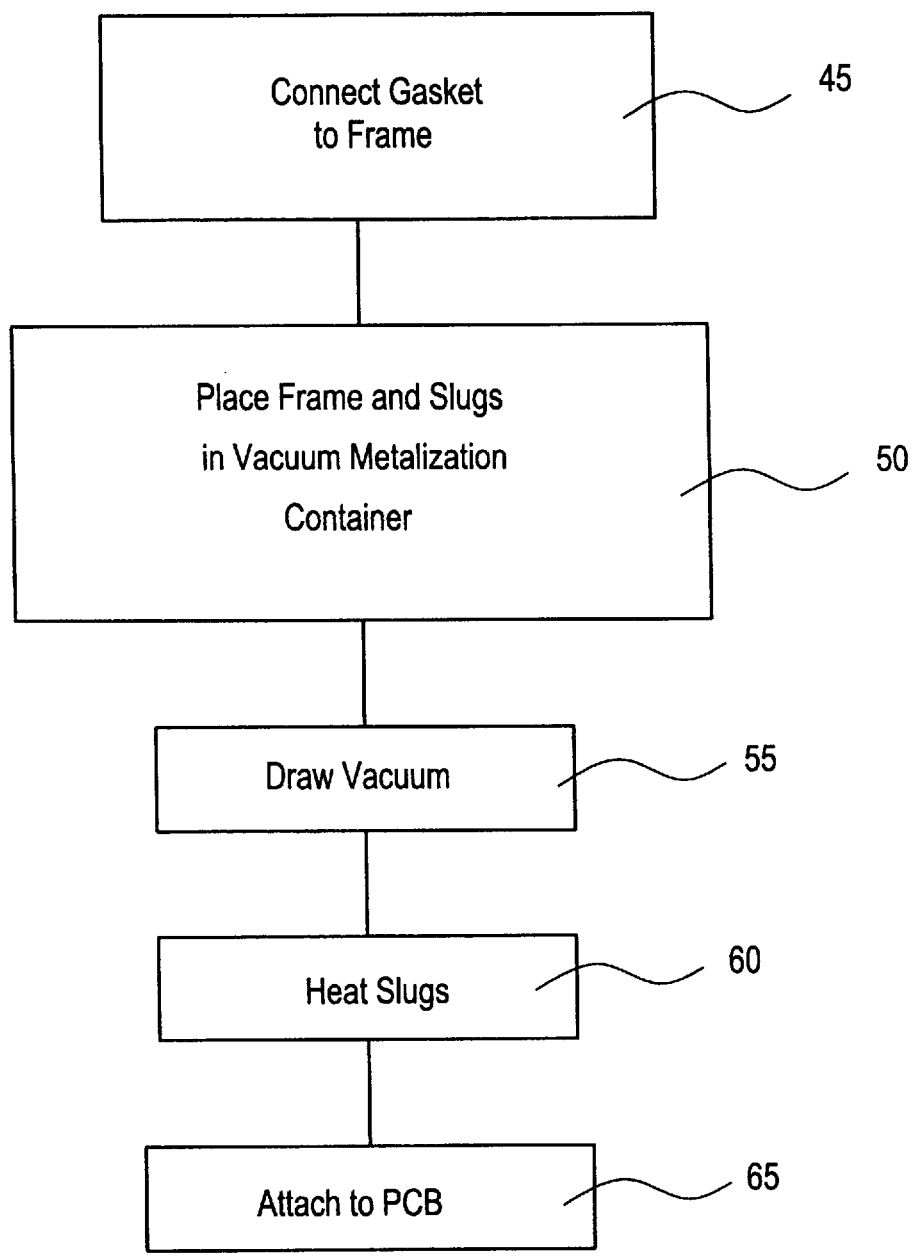
FIG. 4 is a flow chart illustrating the method of the present invention.

Referring now to FIG. 4, there is illustrated a flow chart describing the method for generating the RF shielding of the present invention in conjunction with a vacuum metalization process. Initially, the nonconductive rubber gasket 30 is connected at step 45 to the edge of the plastic frame 25. The frame 25 and gasket 30 are placed into a vacuum metalization container at step 50 along with aluminum (nickel, copper, etc. are also acceptable) slugs that will form the metal plating layer. The container is closed and a vacuum is drawn on the container at step 55. Once the vacuum is drawn, the aluminum slugs within the container are heated at step 60 until they vaporize. The vaporization process leaves a thin coating of aluminum on the interior of the container and everything within the container. Thus, the plastic frame 25 and nonconductive rubber gasket 30 are both coated with a thin aluminum layer that is conductive. The vacuum metalization process provides the nonconductive rubber gasket with a conductive sheath on its exterior. Deformation and stretching of the gasket does not cause the metal plating to peel from the surface of the gasket and diminish the conductive properties of the gasket. The coated gasket and frame are attached to the ground plane of the PCB at step 65 by screwing or sandwiching the frame to the PCB.

While the present invention has been described with respect to the use of vacuum metalization to coat the nonconductive rubber gasket 30 and plastic frame 25 with a conductive outer coating, it should be realized that other methods exist for providing a conductive covering. For example, certain types of metal impregnated paints could be used to cover the surface of the gasket 30 and frame 25 such that a painted RF shield was utilized.

Figure 5:
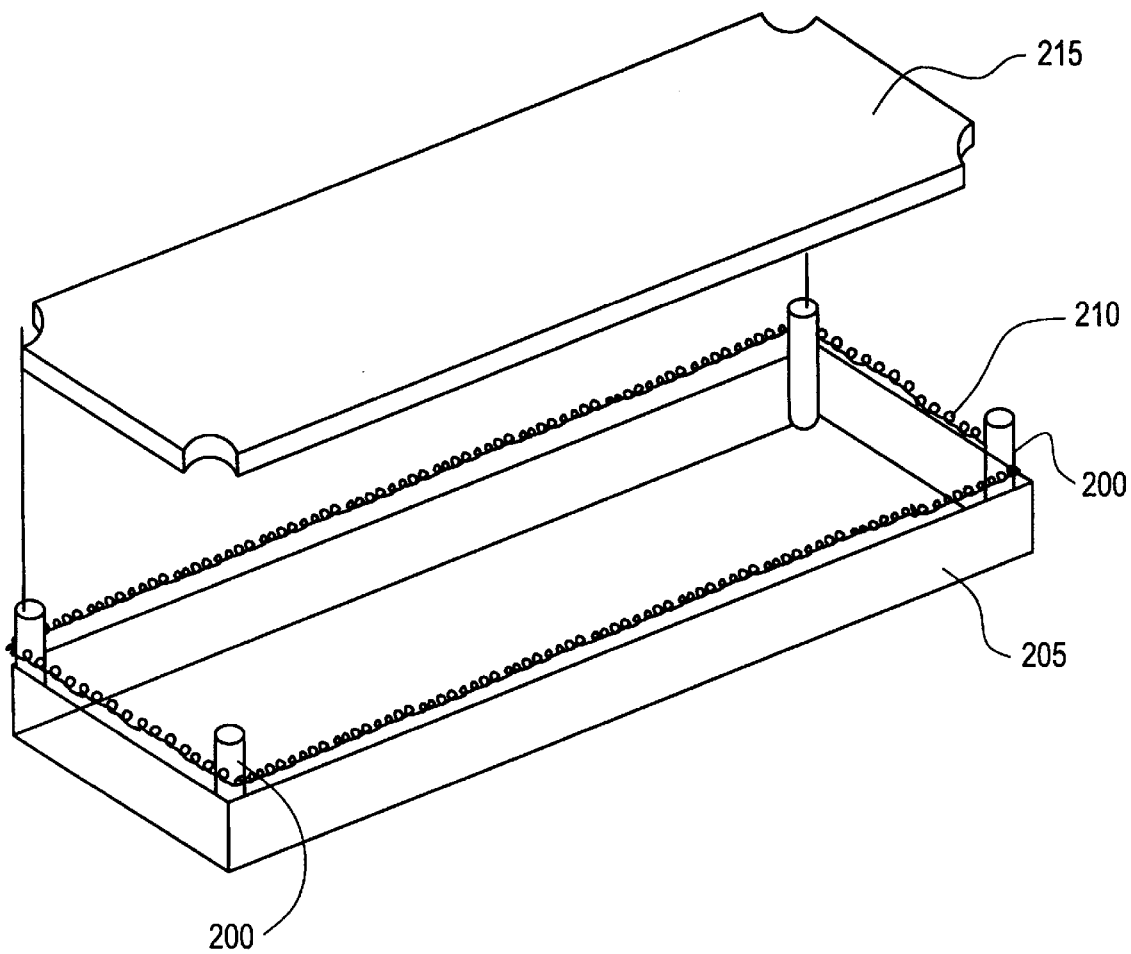
FIG. 5 is an alternative embodiment of the RF shield including a number of guideposts.

Referring now to FIG. 5, there is illustrated an alternative embodiment of the present invention wherein the gasket 210 is attached to the plastic or metal frame 205 using a plurality of guideposts 200. The plastic or metal frame 205 is constructed to cover the electronic components which it will be shielding. The plastic or metal frame 205 can be rectangular, triangular or any other required shape. Guideposts 200 are placed at strategic locations on the plastic frame 205 such that the elastic rubber gasket when stretched between the posts is held in place along the edges of the plastic frame. The number of guideposts 200 on the plastic frame 205 is strictly dependent upon the desired shape of the ground plane of the printed circuit board 215. For example, a square plane would require four guideposts while a triangular plane would require three guideposts.

The rubber gasket 210 is stretched around the guideposts 200 in such a manner that the gasket will electrically mate with the ground plane of the printed circuit board once the vacuum metalization process described previously has occurred. Alternatively, the rubber gasket and plastic frame 205 may be plated separately and then connected together. Also, the system of guideposts can be used with existing impregnated conductive gaskets if so desired.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. An RF shield, comprising:
   a shield frame for covering electronic components to be shielded, the shield frame including a plurality of guideposts along edges thereof;
   an elastic band gasket placed around the plurality of guideposts such that the gasket rests along the edges of the shield frame; and
   a conductive layer covering a predetermined portion of surfaces of the shield frame and gasket.

2. The RF shield of claim 1, wherein the gasket comprises a conductive gasket.

3. The RF shield of claim 1, wherein the gasket comprises a nonconductive gasket.

4. The RF shield of claim 1 wherein the conductive layer comprises aluminum.

5. The RF shield of claim 1 wherein the conductive layer comprises a conductive paint.

6. The RF shield of claim 3 wherein the nonconductive gasket comprises a rubber gasket.

* * * * *